(12) United States Patent
Huang et al.

(10) Patent No.: US 10,746,948 B1
(45) Date of Patent: Aug. 18, 2020

(54) COOLING AND HEATING STRUCTURE FOR FIBER OPTIC TRANSCEIVER

(71) Applicant: MOXA INC., New Taipei (TW)

(72) Inventors: Kuo-An Huang, New Taipei (TW); Chen-Yu Liang, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 16/574,090

(22) Filed: Sep. 18, 2019

(51) Int. Cl.
  *G02B 6/42* (2006.01)
  *H01S 5/024* (2006.01)

(52) U.S. Cl.
  CPC ......... *G02B 6/4271* (2013.01); *G02B 6/4269* (2013.01); *H01S 5/02415* (2013.01)

(58) Field of Classification Search
  None
  See application file for complete search history.

(56) References Cited

U.S. PATENT DOCUMENTS

| | | | | |
|---|---|---|---|---|
| 2009/0195980 A1* | 8/2009 | Shih | ......................... | F25B 21/02 361/688 |
| 2013/0279115 A1* | 10/2013 | Blumenthal | ......... | G02B 6/4271 361/700 |
| 2016/0109670 A1* | 4/2016 | Huang | ................ | G02B 6/4272 361/707 |
| 2016/0269117 A1* | 9/2016 | Chang | ................ | G02B 6/4272 |
| 2017/0150645 A1* | 5/2017 | Huang | ................ | G02B 6/4278 |
| 2018/0129001 A1* | 5/2018 | Van Gaal | ............ | G02B 6/4269 |
| 2019/0041576 A1* | 2/2019 | Byrd | ................... | G02B 6/4246 |
| 2019/0273340 A1* | 9/2019 | D'Inca | ................ | H01R 13/631 |

* cited by examiner

*Primary Examiner* — Tina M Wong
(74) *Attorney, Agent, or Firm* — Winston Hsu

(57) ABSTRACT

A cooling and heating structure for a fiber optic transceiver is disclosed. In the cooling and heating structure, a field programmable gate array (FPGA) chip reads a temperature value of a small form-factor pluggable transceiver (SFP) cage from a sensor, a digital to analog converter (DAC) converts the temperature value into a voltage value, a processing chip converts the voltage value into an output-voltage value, and a thermoelectric cooler (TEC) adjusts a working wattage thereof according to the output-voltage value, so as to control the TEC to cool or heat the SFP cage, thereby achieving the technical effect of using the TEC to cool and heat the SFP cage to prevent link down and instability of the fiber optic transceiver during signal transmission in the high-temperature environment and the low-temperature environment from occurring.

10 Claims, 11 Drawing Sheets

COOLING AND HEATING STRUCTURE FOR FIBER OPTIC TRANSCEIVER

BACKGROUND

1. Technical Field

The present invention relates to a cooling and heating structure, more particularly to a cooling and heating structure, which is applied to a fiber optic transceiver and uses a thermoelectric cooler (TEC) to cool and heat a small form-factor pluggable transceiver (SFP) cage.

2. Description of Related Art

The fiber optical transceiver is one of active fiber components, and is mainly formed by integrating a receiver and a transmitter performing as a receiving end and a transmitting end in the optical fiber communication process. The receiver is used to convert the received optical signal into an electrical signal, and the transmitter is used to convert the electrical signal into an optical signal, and then transmit the optical signal. The receiver and the transmitter of the fiber optic transceiver are packaged in the same module to provide the functions of receiving and transmitting at the same time.

The laser diode in the fiber optic transceiver is very sensitive to temperature and has very poor efficiency in a high-temperature environment, wherein the temperature of the laser diode increases exponentially. When the fiber optical transceiver transmits signals in the high temperature environment, the signals are cut off in an instant. When the fiber optical transceiver is operated in a low-temperature environment, the chip used inside the SFP cage may also cause instability of the transmission signal because of the low temperature environment, and possibly lost packets during signal transmission.

When the fiber optic transceiver operates at a temperature of 90° C., the problems such as packet loss, link down, occur, and these problems may cause failure of the fiber optic transceiver to meet the specifications of the fiber optical transceiver device. At present, in a commercially available fiber optical transceiver device including the fiber optical transceiver, a working temperature of the optical fiber transceiver is usually set as 60° C., and the maximum working temperature can reach 85° C. only when some limiting conditions are satisfied, for example, there is forced convection in the environment, time for operation in a high temperature is limited, the system is operated under a pre-defined mode, and so on.

Therefore, it is necessary to propose an improved technical solution to solve the conventional problem that the link down and instability during signal transmission in the high-temperature environment and the low-temperature environment occur to the fiber optic transceiver of the fiber optic transceiver device.

SUMMARY

In order to solve the conventional technical problem that the link down and instability during signal transmission in the high-temperature environment and the low-temperature environment occur to the fiber optic transceiver of the fiber optic transceiver device, the present invention provides a cooling and heating structure for a fiber optic transceiver.

According to an embodiment, the present invention provides a cooling and heating structure for a fiber optic transceiver, and the cooling and heating structure comprises a circuit board, a SFP cage, a sensor, a thermoelectric cooler (TEC) and a first thermally-conductive metal plate. The circuit board comprises a field programmable gate array (FPGA) chip, a digital to analog converter (DAC), and a processing chip.

The FPGA chip of the circuit board is configured to read a temperature value. The DAC of the circuit board is electrically connected to the FPGA chip of the circuit board and configured to convert the temperature value into a voltage value. The processing chip of the circuit board is electrically connected to the DAC of the circuit board and configured to convert the voltage value into an output-voltage value. The SFP cage is disposed on the circuit board, and the sensor is disposed in the SFP cage and configured to sense the temperature of the SFP cage to output the temperature value. The sensor is electrically connected to the FPGA chip and provides the temperature value to the FPGA chip. The TEC is attached with the SFP cage via a first thermal putty layer, and is electrically connected to the processing chip to obtain the output-voltage value, and then adjusts a working wattage of the TEC according to the output-voltage value, so as to control a surface, attaching with the SFP cage, of the TEC to be a high-temperature surface or a low-temperature surface, and control the other surface, opposite to the surface attaching with the SFP cage, of the TEC to be the low-temperature surface or the high-temperature surface. The first thermally-conductive metal plate is attached with the TEC by a second thermal putty layer coated on a first terminal of the first thermally-conductive metal plate, and a middle section of the first thermally-conductive metal plate is covered by aerogel insulation material.

According to an embodiment of the cooling and heating structure for fiber optic transceiver, the cooling and heating structure can further comprise a second thermally-conductive metal plate which is bonded between a second terminal of the first thermally-conductive metal plate and a housing by thermal adhesive, so that the second terminal of the first thermally-conductive metal plate can dissipate heat through the housing and the second thermally-conductive metal plate.

According to an embodiment of the cooling and heating structure for fiber optic transceiver, the housing comprises a hollow part configured to expose the SFP cage out of the housing.

According to an embodiment of the cooling and heating structure for fiber optic transceiver, the housing has a plurality of heatsinks disposed on an outer part thereof and opposite to the hollow part.

According to an embodiment of the cooling and heating structure for fiber optic transceiver, the first thermally-conductive metal plate is in an L shape, so that the second terminal of the first thermally-conductive metal plate can contact an inner part, corresponding to the plurality of heatsinks, of the housing through the second thermally-conductive metal plate.

According to an embodiment of the cooling and heating structure for fiber optic transceiver, the first thermally-conductive metal plate fast conducts heat to the second thermally-conductive metal plate through two-phase flow inside the first thermally-conductive metal plate, so as to dissipate heat.

According to an embodiment of the cooling and heating structure for fiber optic transceiver, the aerogel insulation material covering the middle section of the first thermally-conductive metal plate is configured to provide a space between the first thermally-conductive metal plate and the housing, to avoid contact between the heat source and the housing, resulting in an increase in an ambient temperature of a fiber optic transceiver device.

According to an embodiment of the cooling and heating structure for fiber optic transceiver, the DAC converts the temperature value into the voltage value which is in a range of 0.1 volts to 1 volt.

According to an embodiment of the cooling and heating structure for fiber optic transceiver, the processing chip sets a voltage converter of the processing chip according to the voltage value, to adjust the range of the output-voltage value of the processing chip to be between −12 volts and 12 volts.

According to an embodiment of the cooling and heating structure for fiber optic transceiver, the cooling and heating structure comprises a thermal pad and a metal plate, the thermal pad and the SFP cage are attached with each other, the metal plate is attached with the thermal pad, and the TEC is attached with the metal plate through the first thermal putty layer.

According to above-mentioned contents, the difference between the cooling and heating structure of the present invention and the conventional technology is that the cooling and heating structure of the present invention uses the FPGA chip to read the temperature value of the SFP cage from the sensor, uses the DAC to convert the temperature value into the voltage value, and uses the processing chip to convert the voltage value into the output-voltage value, and the TEC can adjust the working wattage thereof according to the output-voltage value, so as to control the TEC to cool or heat the SFP cage.

According to the above-aforementioned technical solution, the cooling and heating structure of the present invention can achieve technical effect of using the TEC to cool or heat the SFP cage, so as to prevent the fiber optic transceiver from link down and instability during signal transmission in the high-temperature environment and the low-temperature environment.

BRIEF DESCRIPTION OF THE DRAWINGS

The structure, operating principle and effects of the present invention will be described in detail by way of various embodiments which are illustrated in the accompanying drawings.

DETAILED DESCRIPTION

Figure 1:
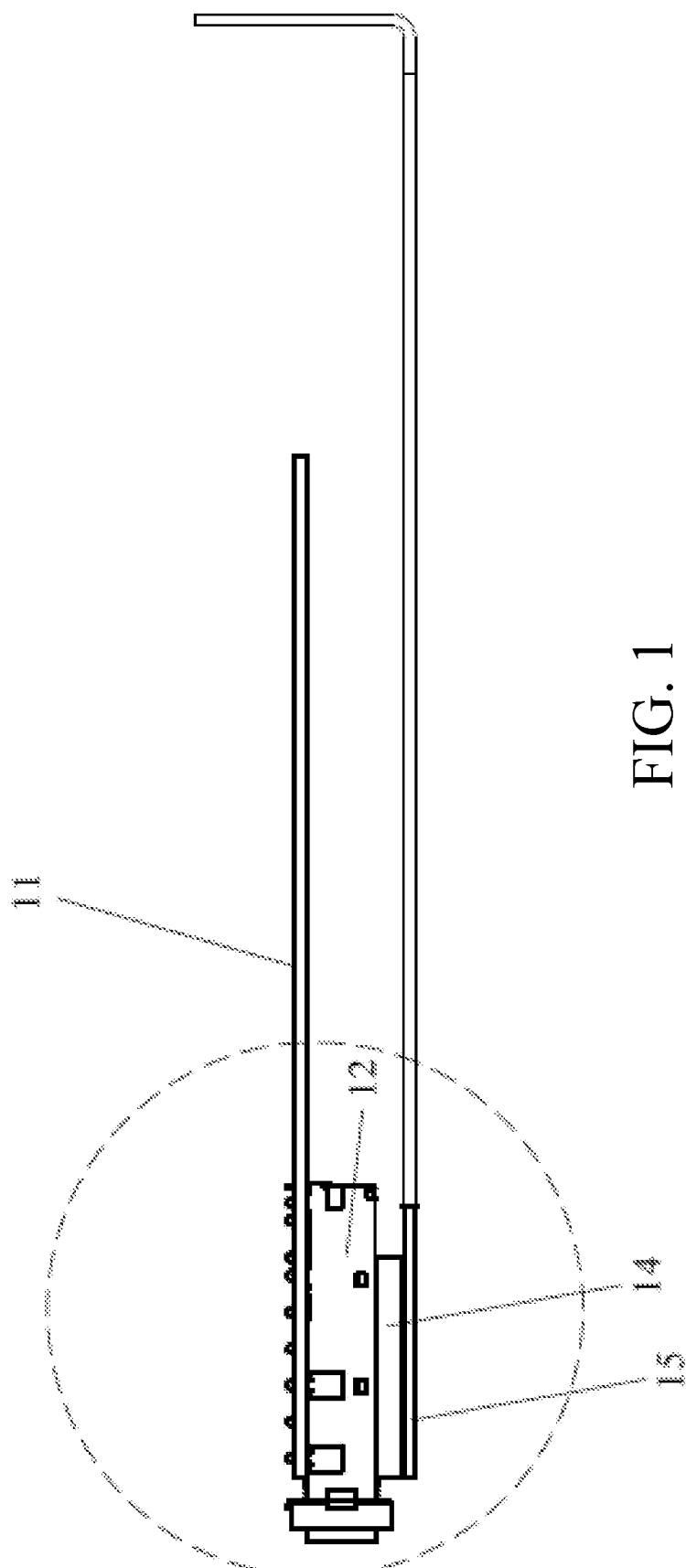
FIG. 1 is a plan view of a cooling and heating structure for a fiber optic transceiver, according to a first embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

The cooling and heating structure for the fiber optic transceiver according to the present invention is illustrated in following paragraphs. Please refer to FIG. 1, which is a plan view of a cooling and heating structure for a fiber optic transceiver, according to a first embodiment of the present invention.

According to an embodiment of the present invention, a cooling and heating structure for a fiber optic transceiver, can include a circuit board 11, a SFP cage 12, a sensor 13, a TEC 14, and a first thermally-conductive metal plate 15.

Figure 2:
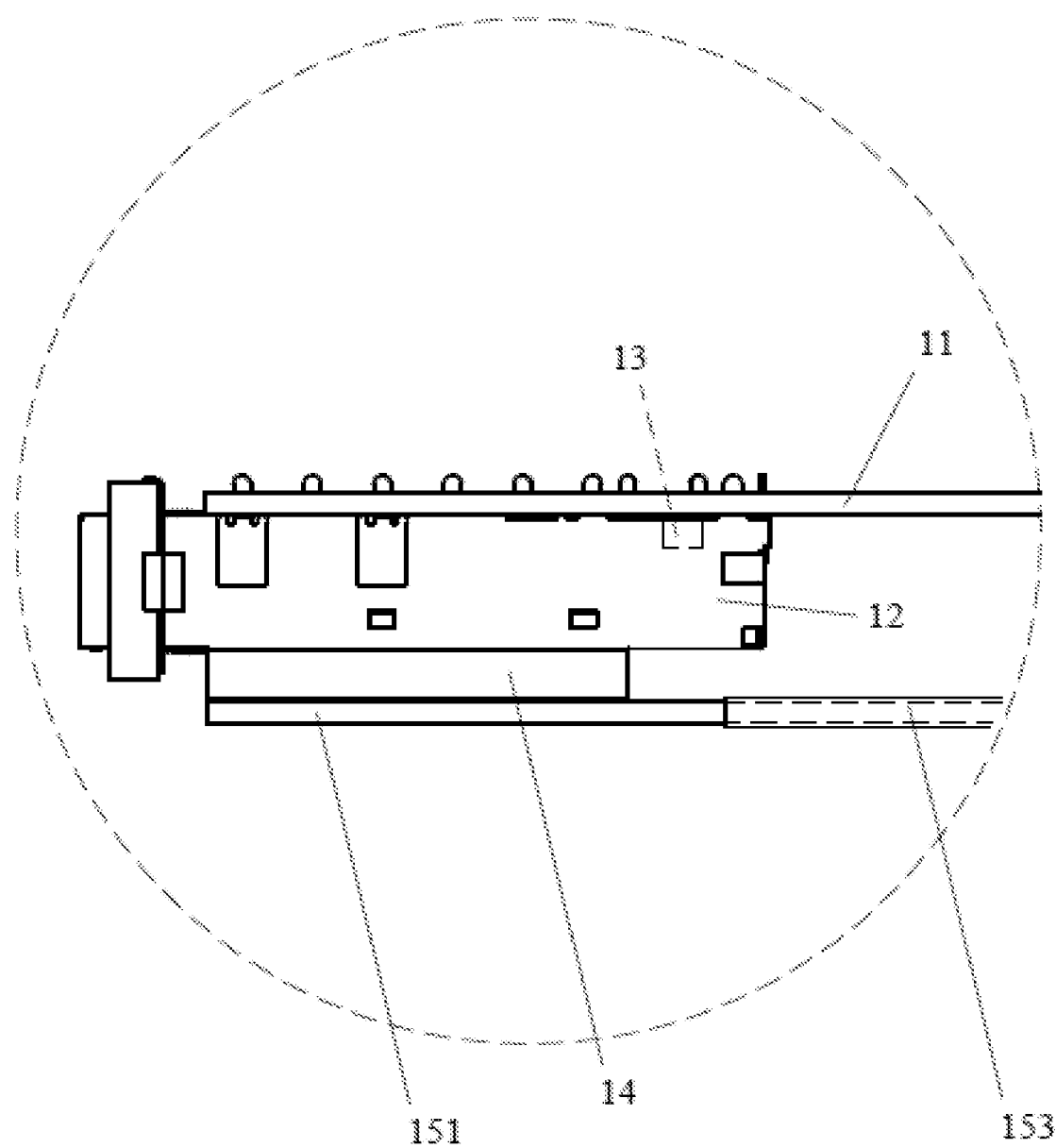
FIG. 2 is an enlarged plan view of a part of the cooling and heating structure for the fiber optic transceiver, according to the first embodiment of the present invention.

Please refer to FIG. 2, which is an enlarged plan view of a part of the cooling and heating structure for the fiber optic transceiver, according to the first embodiment of the present invention.

Figure 9:
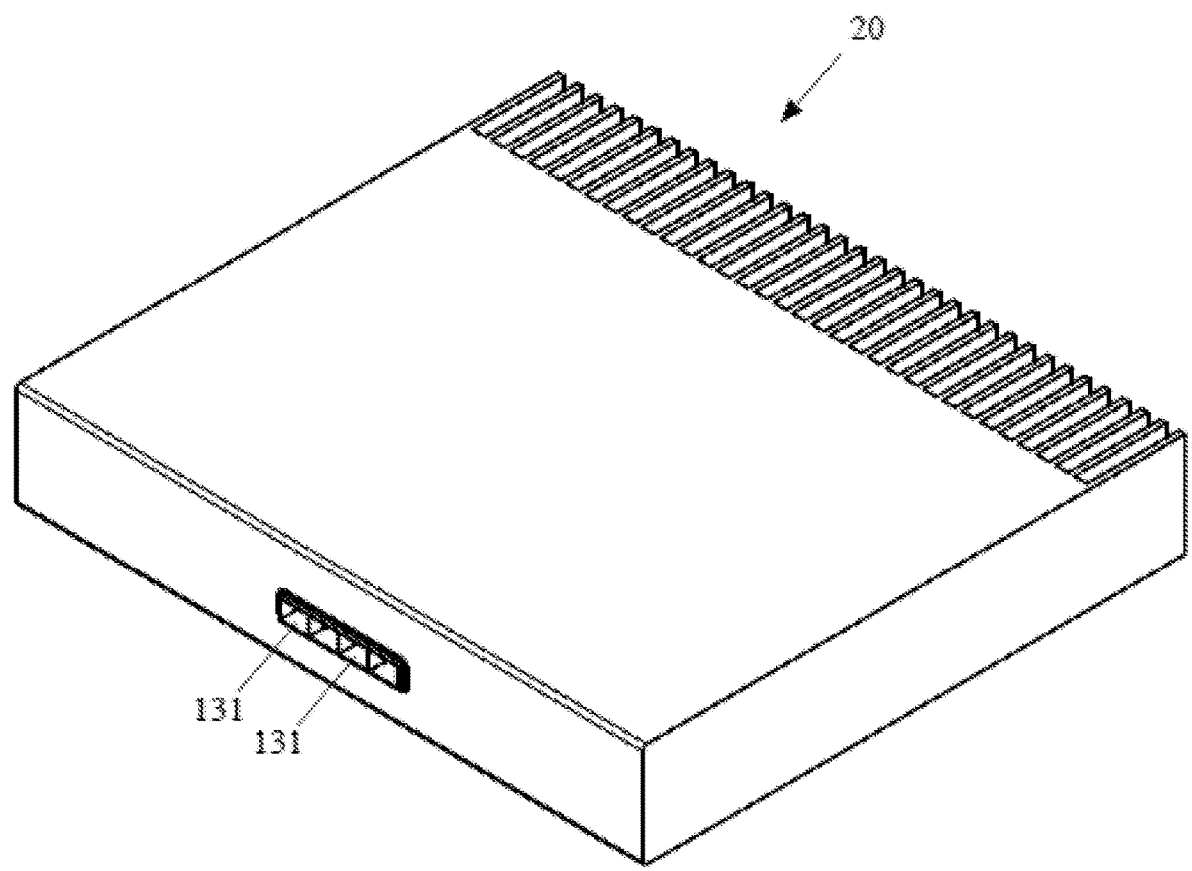
FIG. 9 is a perspective view of a fiber optic transceiver device, according to the present invention.

The SFP cage 12 is disposed on the circuit board 11 and electrically connected to the circuit board 11. The SFP cage 12 includes at least two SFPs 121, as shown in FIG. 9, and each SFP 121 of the SFP cage 12 can be plugged with an external connector.

The sensor 13 is attached with the SFP cage 12 and disposed inside the SFP cage 12, and configured to sense a temperature of the SFP cage 12 to output a temperature value. The sensor 13 is electrically connected to the circuit board 11 through a connection part between the SFP cage 12 and the circuit board 11, so that the sensor 13 can provide the measured temperature value of the SFP cage 12 for sequential adjustment of a working wattage of the TEC 14.

The TEC 14 is attached with the SFP cage 12 through a first thermal putty layer, and the first thermally-conductive metal plate 15 is attached with the TEC 14 through a second thermal putty layer coated on the first terminal 151 of the first thermally-conductive metal plate 15. A middle section 153 of the first thermally-conductive metal plate 15 is covered by aerogel insulation material.

It should be noted that the aerogel insulation material covering the middle section 153 of the first thermally-conductive metal plate 15 is configured to provide a space between the first thermally-conductive metal plate 15 and the housing 21, to prevent increasing of a temperature of environment around the fiber optic transceiver device 20 due to a heat source touching the housing 21.

Figure 3:
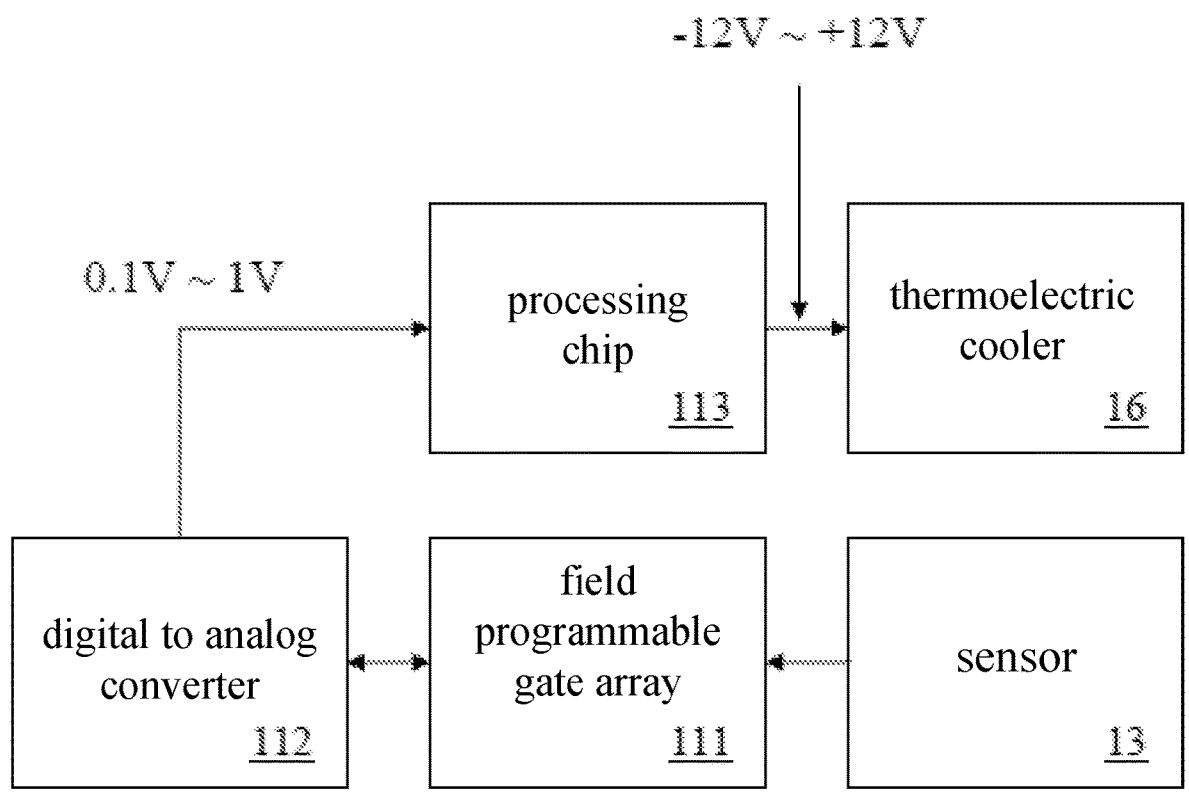
FIG. 3 is a block view of cooling and heating control operation of the cooling and heating structure for the fiber optic transceiver, according to the first embodiment of the present invention.

Please refer to FIG. 3, which is a block view of cooling and heating control operation of the cooling and heating structure for the fiber optic transceiver, according to the first embodiment of the present invention.

The circuit board 11 further comprises a FPGA chip 111, a DAC 112 and a processing chip 113.

The sensor 13 disposed in the SFP cage 12 is electrically connected to the FPGA chip 111 of the circuit board 11. The sensor 13 can measure the temperature of the SFP cage 12 to output a temperature value. The FPGA chip 111 of the circuit board 11 can read the temperature value form the sensor 13 corresponding to the temperature of the SFP cage 12 measured by the sensor 13. The DAC 112 of the circuit board 11 is electrically connected to the FPGA chip 111 of the circuit board 11 and configured to convert the temperature value, read by the FPGA chip 111 of the circuit board 11, into a voltage value. The processing chip 113 of the circuit board 11 is electrically connected to the DAC 112 of the circuit board 11 and configured to convert the voltage value, converted by the DAC 112 of the circuit board 11, into an output-voltage value.

The TEC 14 is electrically connected to the processing chip 113 of the circuit board 11, and obtains the output-voltage value from the processing chip 113 of the circuit board 11. The TEC 14 can adjust the working wattage thereof according to the output-voltage value, so as to control a surface, attaching with the SFP cage 12, of the TEC 14 to be a high-temperature surface or a low-temperature surface, and control the other surface, opposite to the surface attaching with the SFP cage 12, of the TEC 14 to be the low-temperature surface or the high-temperature surface.

It should be noted that the FPGA chip 111 of the circuit board 11 can regulate an output-voltage value, which is converted by the processing chip 113, by a PWM control manner, so as to further control the working wattage of the TEC 14, for example, to increase the working wattage of the TEC 14 when the TEC 14 needs to increase or decrease temperature, and to decrease the working wattage of the TEC 14 when the TEC 14 does not need to increase or decrease temperature, thereby achieving the purpose and effect of saving power, and reducing the temperature variation of the SFP cage 12.

It should be noted that the sensor 13, the FPGA chip 111 of the circuit board 11, and the DAC 112 of the circuit board 11 transmit data to each other through inter-integrated circuit (IIC), the DAC 112 of the circuit board 11 can convert the temperature value into the voltage value which is in a range of 0.1 volts to 1 volt, the processing chip 113 of the circuit board 11 can set the voltage converter of the processing chip 113 according to the voltage value, so as to adjust the output-voltage value of the processing chip 113 to be between −12 volts and 12 volts.

Figure 4A:
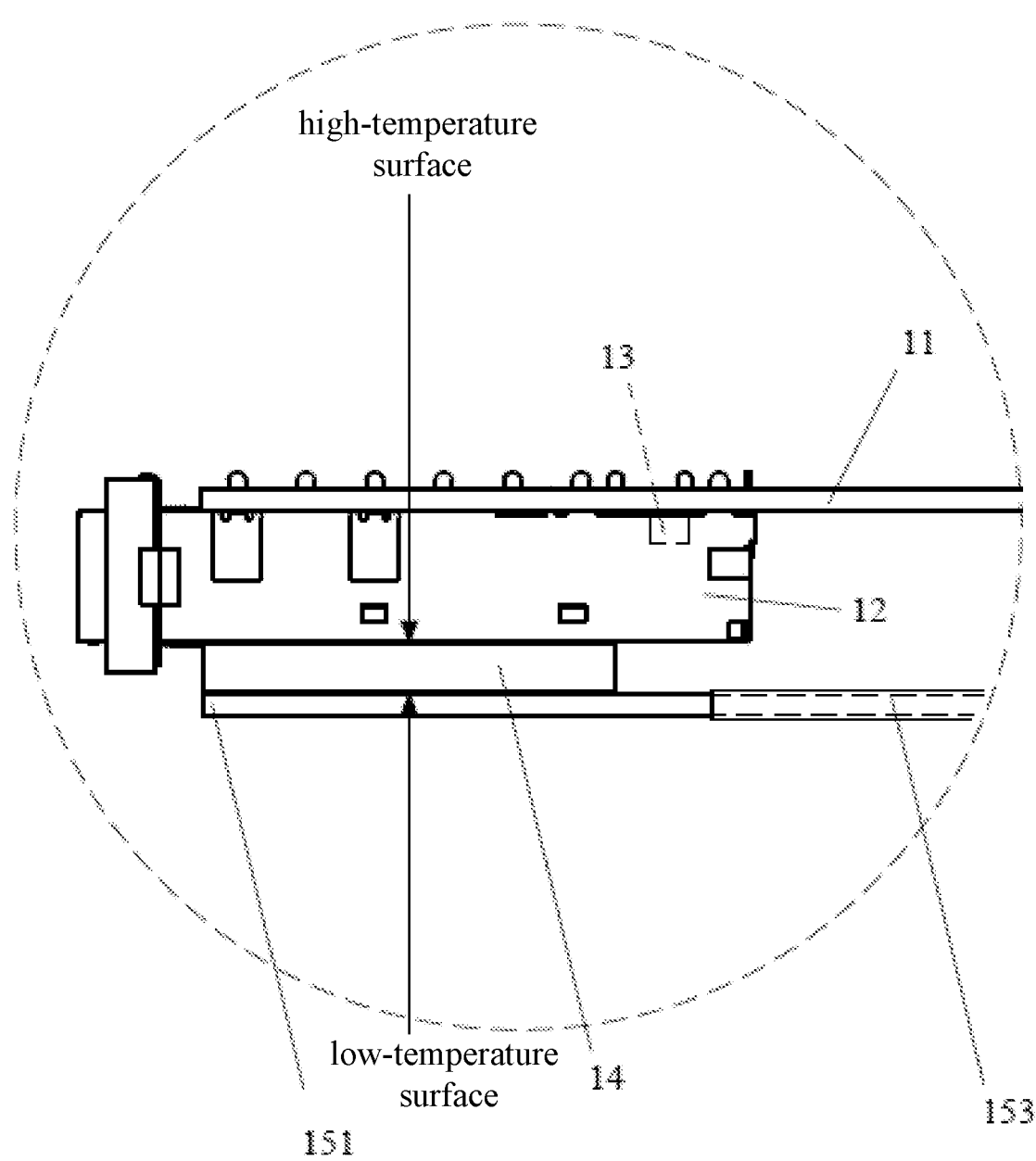
FIGS. 4A and 4B are enlarged plan views of a part of the cooling and heating structure for the fiber optic transceiver, according to the first embodiment of the present invention.

Please refer to FIGS. 3 and 4A. FIG. 4A is an enlarged sectional view of a part of the cooling and heating structure for the fiber optic transceiver, according to the first embodiment of the present invention.

When the temperature value of the SFP cage 12 is high, the temperature value of the SFP cage 12, read by the FPGA chip 111 of the circuit board 11 from the sensor 13, is converted to the voltage value of 1 volt, by the DAC 112 of the circuit board 11; next, the processing chip 113 of the circuit board 11 can use the voltage value of 1 volt, which is converted by the DAC 112 of the circuit board 11, to set the voltage converter in the processing chip 113, so as to adjust the output-voltage value of the processing chip 113 to be 12 volts.

According to the output-voltage value of 12 volts obtained from the processing chip 113 of the circuit board 11, the TEC 14 adjusts the working wattage thereof, so as to control the surface, attaching with the SFP cage 12, of the TEC 14 to be a low-temperature surface, and control the other surface, opposite to the surface attaching with the SFP cage 12, of the TEC 14 to be a high-temperature surface, thereby cooling the SFP cage 12 through the first thermally-conductive metal plate 15.

Figure 4B:
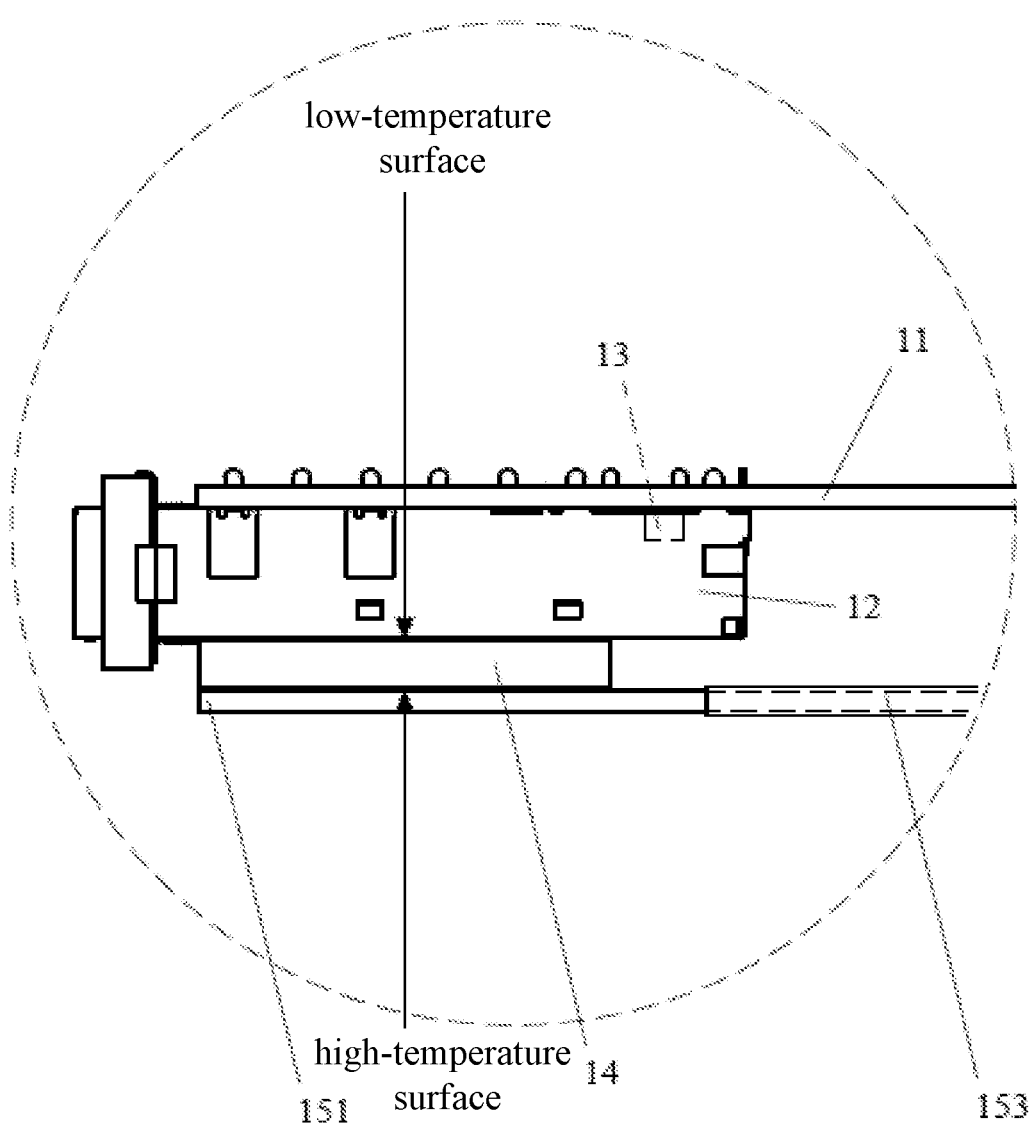

Please refer to FIGS. 3 and 4B. FIG. 4B is an enlarged sectional view of a part of the cooling and heating structure for the fiber optic transceiver, according to the first embodiment of the present invention.

When the temperature value of the SFP cage 12 is low, the temperature value of the SFP cage 12 read by the FPGA chip 111 of the circuit board 11 from the sensor 13, is converted into the voltage value of 0.1 volts by the DAC 112 of the circuit board 11, and the processing chip 113 can use the voltage value of 0.1 volts, which is converted by the DAC 112, to set the voltage converter of the processing chip 113, so as to adjust the output-voltage value of the processing chip 113 to be −12 volts.

According to the output-voltage value of −12 volts obtained from the processing chip 113 of the circuit board 11, the TEC 14 can adjust the working wattage thereof, so as to control the surface, attaching with the SFP cage 12, of the TEC 14 to be the high-temperature surface, and control the other surface, opposite to the surface attaching with the SFP cage 12, of the TEC 14 to be the low-temperature surface, thereby heating the SFP cage 12. As a result, the problem that the fiber optic transceiver is unstable in signal transmission because of excessively-low temperature can be solved.

Figure 5:
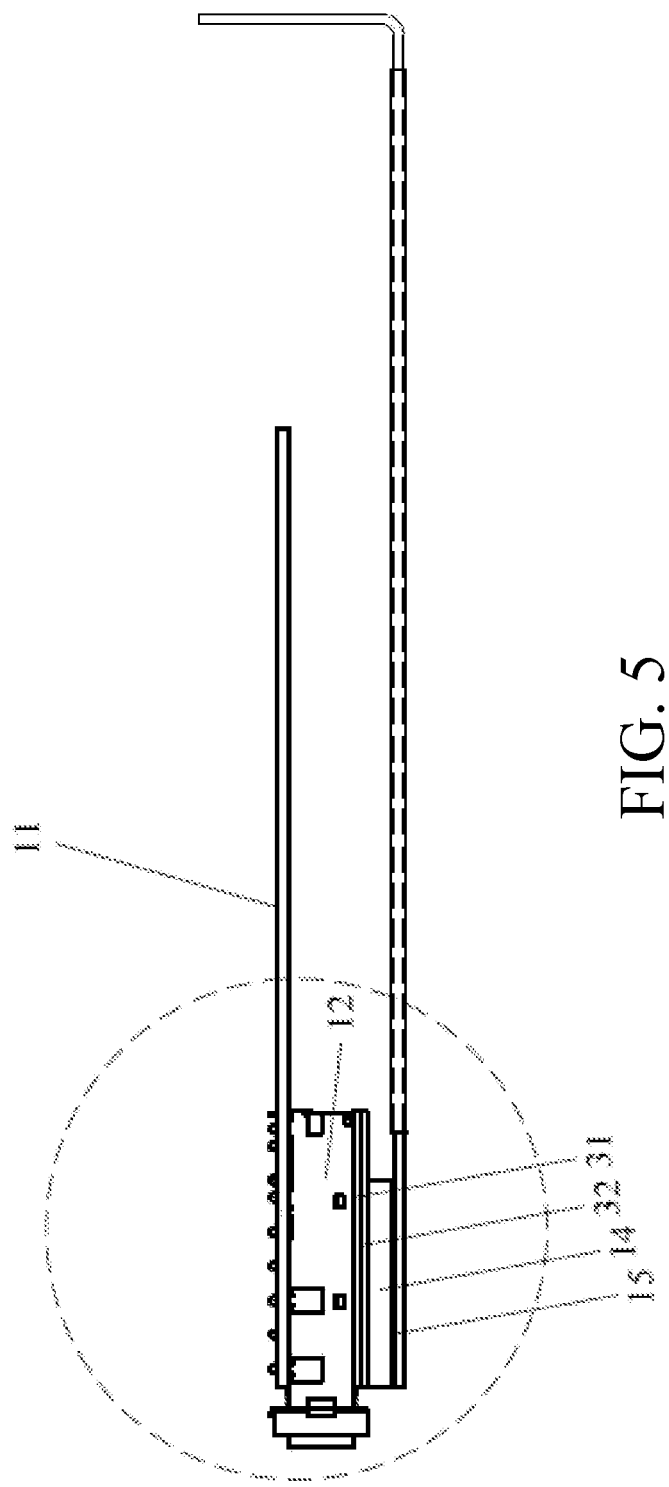
FIG. 5 is a plan view of a cooling and heating structure for a fiber optic transceiver, according to a second embodiment of the present invention.
Figure 6:
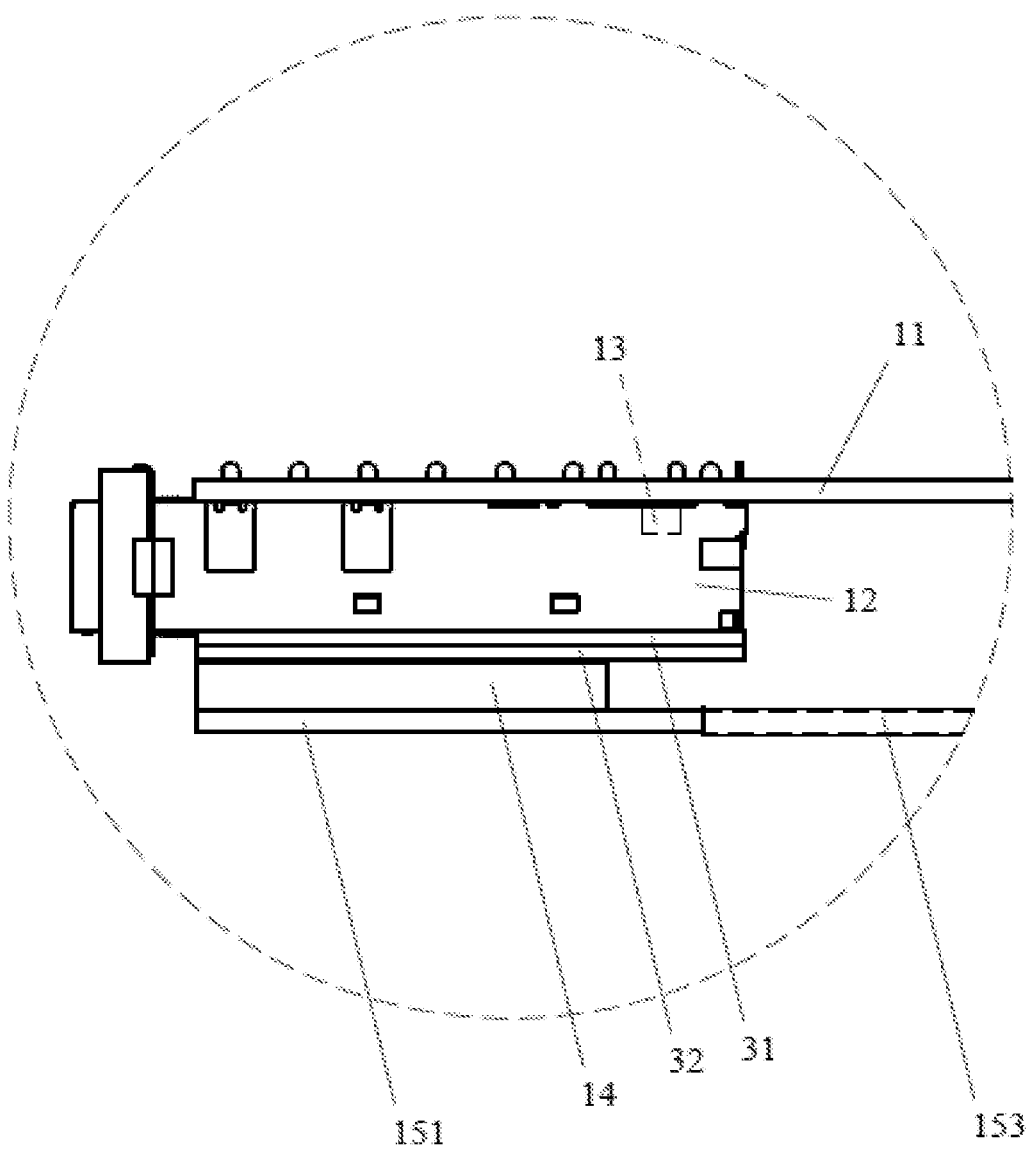
FIG. 6 is an enlarged plan view of a part of the cooling and heating structure for the fiber optic transceiver, according to the second embodiment of the present invention.

Please refer to FIGS. 5 and 6. FIG. 5 is a plan view of a cooling and heating structure for a fiber optic transceiver, according to a second embodiment of the present invention, and FIG. 6 is an enlarged plan view of a part of the cooling and heating structure for the fiber optic transceiver, according to the second embodiment of the present invention.

The cooling and heating structure can include a thermal pad 31 and a metal plate 32. The thermal pad 31 and the SFP cage 12 are attached with each other, the metal plate 32 is attached with the thermal pad 31, and the TEC 14 is attached with the metal plate 32 through the first thermal putty layer. The surface of the TEC 14 attaching between the SFP cage 12 is not fully flat, so a gap is formed between the TEC 14 and the SFP cage 12 to cause the thermal resistance of air. For this reason, the thermal pad 31 can be used to effectively pad the non-flat surface of the TEC 14 attaching with the SFP cage 12, to prevent the thermal resistance of air from occurring, so as to increase the thermal conduction performance. The thermal conductivity of the metal plate 32 is better than that of the thermal pad 31, so the metal plate 32 can fast conduct heat planarly to uniformly heat or cool the SFP cage 12 when the TEC 14 performs heating or cooling operation.

Figure 7:
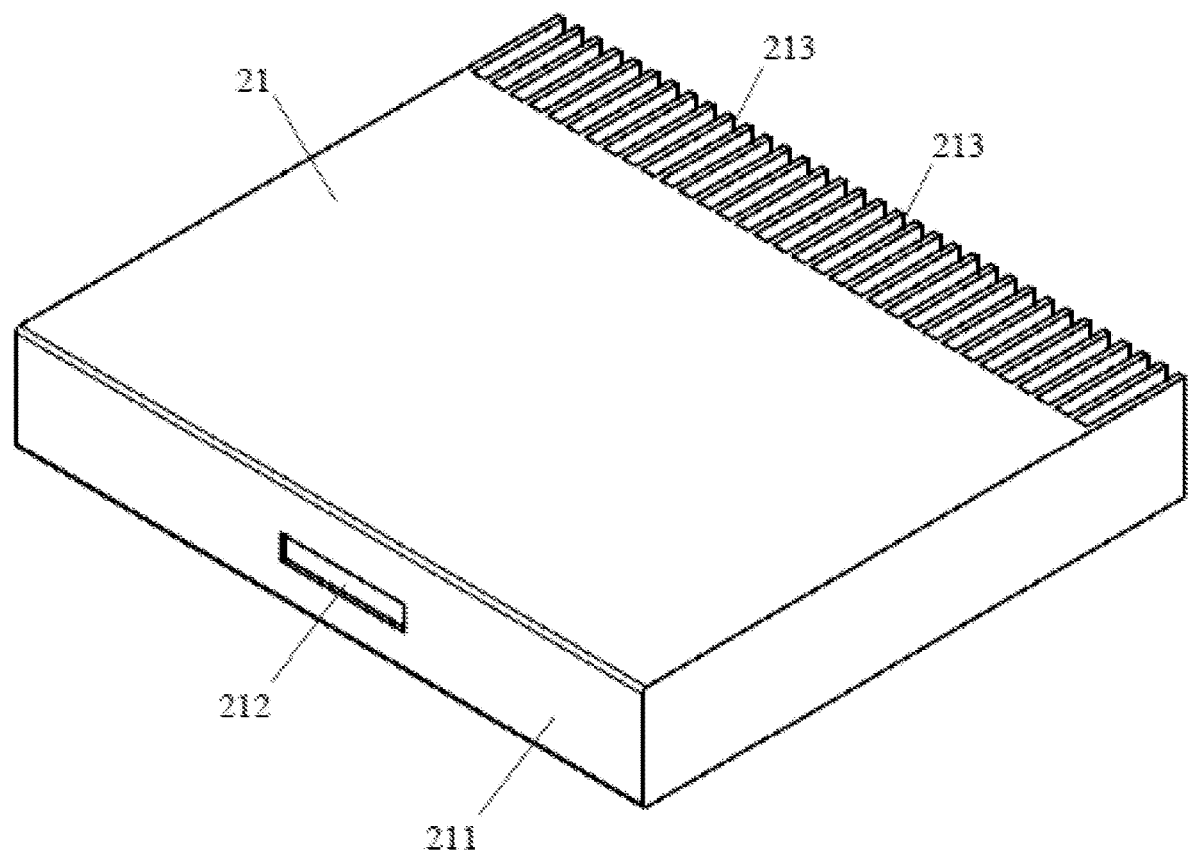
FIG. 7 is a perspective view of a housing of a cooling and heating structure for a fiber optic transceiver, according to the present invention.

Please refer to FIG. 7, which is a perspective view of a housing of a cooling and heating structure for a fiber optic transceiver, according to the present invention.

The housing 21 can include a hollow part 212 formed on a first surface 211 thereof, and a plurality of heatsinks 213 formed on a second surface thereof, and the first surface 211 of the housing 21 is opposite to the second surface of the housing 21. The housing 21 is made by metal material with good thermal conduction, for example, the metal material can be iron, steel, aluminum alloy, and so on; however, these examples are merely for exemplary illustration, and the application field of the present invention is not limited thereto.

Figure 8A:
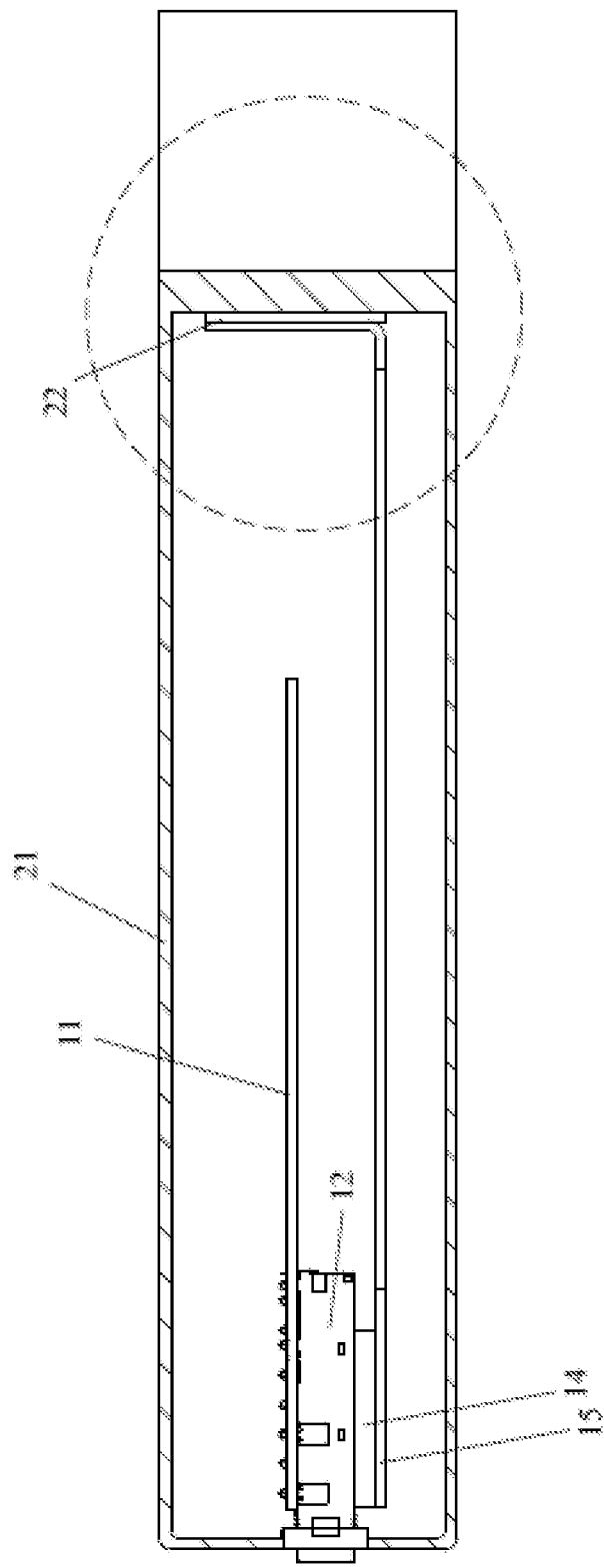
FIG. 8A is a sectional view of a fiber optic transceiver device applied with a cooling and heating structure, according to the present invention.
Figure 8B:
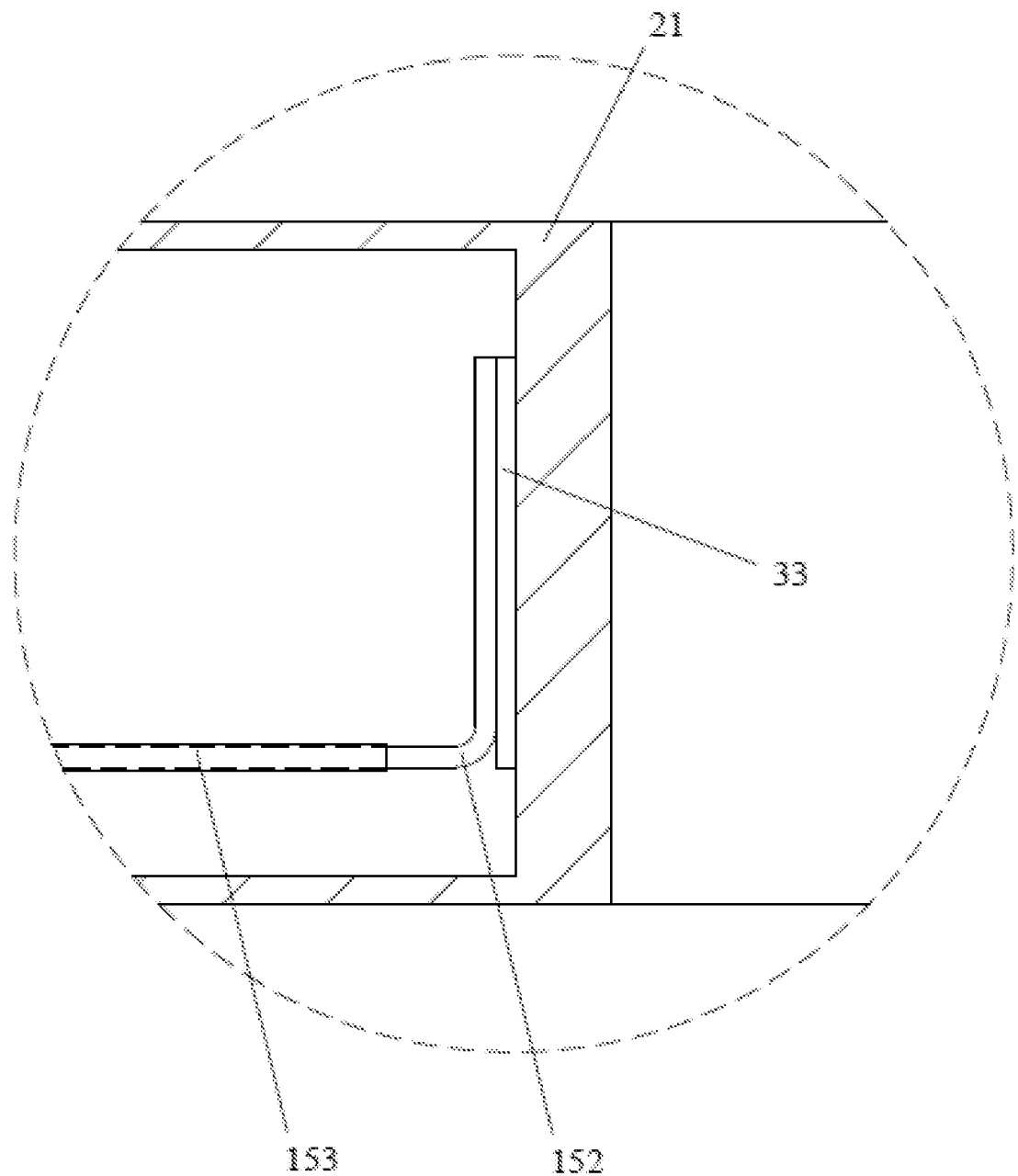
FIG. 8B is an enlarged sectional view of a part of the fiber optic transceiver device applied with the cooling and heating structure, according to the present invention.

Please refer to FIGS. 8A and 8B. FIG. 8A is a sectional view of a fiber optic transceiver device applied with the cooling and heating structure, according to the present invention, and FIG. 8B is an enlarged sectional view of a part of the fiber optic transceiver device applied with the cooling and heating structure, according to the present invention.

The cooling and heating structure of the present invention is disposed in the housing 21, and the second thermally-conductive metal plate 33 is bonded between the second terminal 152 of the first thermally-conductive metal plate 15 and the housing 21 by thermal adhesive. The cooling and heating structure can dissipate heat through the second terminal 152 of the first thermally-conductive metal plate 15, the second thermally-conductive metal plate 33, the housing 21 and the plurality of heatsinks 213 of the housing 21.

It should be noted that the first thermally-conductive metal plate 15 is in an L shape, so that the second terminal 152 of the first thermally-conductive metal plate 15 can contact an inner part, corresponding to the heatsinks 213, of the housing 21 through the second thermally-conductive metal plate 33, and the first thermally-conductive metal plate 15 can fast conduct heat to the second thermally-conductive metal plate 33 through two-phase flow inside the first thermally-conductive metal plate 15, to dissipate heat.

It should be noted that the aerogel insulation material covering the middle section 153 of the first thermally-conductive metal plate 15 can provide a space between the first thermally-conductive metal plate 15 and the housing 21, to avoid contact between the heat source and the housing, resulting in an increase in an ambient temperature of a fiber optic transceiver device 20.

The housing 21 and the cooling and heating structure can be assembled to form the fiber optic transceiver 20, as shown in FIG. 9, which is a perspective view of a fiber optic transceiver device according to the present invention.

The cooling and heating structure of the present invention can cool the SFP cage 12 when the temperature of the SFP cage 12 is high, and heat the SFP cage 12 when the temperature of the SFP cage 12 is low, so as to solve the problem that packet loss or link down of the fiber optic transceiver occurs in the high-temperature environment and the low-temperature environment, and to control the working wattage of the TEC 14, thereby achieving the purpose and effect of saving power and reducing the temperature variation of the SFP cage 12.

According to above-mentioned contents, the difference between the cooling and heating structure of the present invention and conventional technology is that the cooling and heating structure of the present invention can use the FPGA chip to read the temperature value of the SFP cage from the sensor, use the DAC to convert the temperature value into the voltage value, and use the processing chip to convert the voltage value into the output-voltage value, so as to adjust the working wattage of the TEC according to the output-voltage value, to control the TEC to cool or heat the SFP cage.

By the above-mentioned technical solution, the conventional problems that link down and instability of the fiber optic transceiver during signal transmission in the high-temperature environment and the low-temperature environment may occur can be solved, and the technical effect of using the TEC to cool and heat the SFP cage to prevent the fiber optic transceiver from link down and instability during signal transmission in the high-temperature environment and the low-temperature environment, respectively, can be achieved.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A cooling and heating structure for a fiber optic transceiver, comprising:
    a circuit board comprising:
        a field programmable gate array (FPGA) chip configured to read a temperature value;
        a digital to analog converter (DAC) electrically connected to the FPGA chip and configured to convert the temperature value into a voltage value; and
        a processing chip electrically connected to the DAC and configured to convert the voltage value into an output-voltage value;
    a small form-factor pluggable transceiver (SFP) cage disposed on the circuit board;
    a sensor disposed in the SFP cage and configured to sense the temperature of the SFP cage to output the temperature value, wherein the sensor is electrically connected to the FPGA chip to provide the temperature value;
    a thermoelectric cooler (TEC) attached with the SFP cage through a first thermal putty layer, and electrically connected to the processing chip to obtain the output-voltage value, and adjust a working wattage thereof according to the output-voltage value, so as to control a surface, attaching with the SFP cage, of the TEC to be a high-temperature surface or a low-temperature surface, and control the other surface, opposite to the surface attaching with the SFP cage, of the TEC to be the low-temperature surface or the high-temperature surface; and a first thermally-conductive metal plate attached with the TEC through a second thermal putty layer coated on a first terminal thereof, wherein a middle section of the first thermally-conductive metal plate is covered by aerogel insulation material.

2. The cooling and heating structure according to claim 1, further comprising:
a second thermally-conductive metal plate bonded between a second terminal of the first thermally-conductive metal plate and a housing by thermal adhesive, wherein the second terminal of the first thermally-conductive metal plate dissipates heat through the housing and the second thermally-conductive metal plate.

3. The cooling and heating structure according to claim 2, wherein the housing comprises a hollow part configured to expose the SFP cage out of the housing.

4. The cooling and heating structure according to claim 3, wherein the housing comprises a plurality of heatsinks disposed on an outer part thereof and opposite to the hollow part.

5. The cooling and heating structure according to claim 4, wherein the first thermally-conductive metal plate is in an L shape, the second terminal of the first thermally-conductive metal plate contacts an inner part, corresponding to the plurality of heatsinks, of the housing through the second thermally-conductive metal plate.

6. The cooling and heating structure according to claim 2, wherein the first thermally-conductive metal plate fast conducts heat to the second thermally-conductive metal plate through two-phase flow inside the first thermally-conductive metal plate, for heat dissipation.

7. The cooling and heating structure according to claim 2, wherein the aerogel insulation material covering the middle section of the first thermally-conductive metal plate is configured to provide a space between the first thermally-conductive metal plate and the housing, to avoid contact between a heat source and the housing, resulting in an increase in an ambient temperature of a fiber optic transceiver device.

8. The cooling and heating structure according to claim 1, wherein the DAC converts the temperature value into the voltage value which is in a range of 0.1 volts to 1 volt.

9. The cooling and heating structure according to claim 1, wherein the processing chip sets a voltage converter of the processing chip according to the voltage value, to adjust a range of the output-voltage value of the processing chip to be between −12 volts and 12 volts.

10. The cooling and heating structure according to claim 1, further comprising a thermal pad and a metal plate, wherein the thermal pad and the SFP cage are attached with each other, the metal plate is attached with the thermal pad, and the TEC is attached with the metal plate through the first thermal putty layer.

* * * * *